United States Patent
Margulies et al.

(10) Patent No.: US 11,991,892 B2
(45) Date of Patent: *May 21, 2024

(54) ORGANIC ELECTROLUMINESCENT DEVICES CONTAINING A NEAR-INFRARED DOWN-CONVERSION LAYER

(71) Applicant: Universal Display Corporation, Ewing, NJ (US)

(72) Inventors: Eric A. Margulies, Philadelphia, PA (US); Nicholas J. Thompson, New Hope, PA (US); Michael Stuart Weaver, Princeton, NJ (US); Michael Hack, Carmel, CA (US)

(73) Assignee: Universal Display Corporation, Ewing, NJ (US)

( * ) Notice: Subject to any disclaimer, the term of this patent is extended or adjusted under 35 U.S.C. 154(b) by 456 days.

This patent is subject to a terminal disclaimer.

(21) Appl. No.: 17/313,030

(22) Filed: May 6, 2021

(65) Prior Publication Data

US 2021/0280812 A1    Sep. 9, 2021

Related U.S. Application Data

(63) Continuation of application No. 16/217,104, filed on Dec. 12, 2018, now Pat. No. 11,139,444.
(Continued)

(51) Int. Cl.
*H10K 50/125*    (2023.01)
*H10K 59/38*    (2023.01)

(52) U.S. Cl.
CPC ........... *H10K 50/125* (2023.02); *H10K 59/38* (2023.02)

(58) Field of Classification Search
CPC ............................ H10K 50/125; H10K 59/38
(Continued)

(56) References Cited

U.S. PATENT DOCUMENTS

| 4,769,292 A | 9/1988 | Tang |
| 5,247,190 A | 9/1993 | Friend |

(Continued)

FOREIGN PATENT DOCUMENTS

| WO | 2008057394 A1 | 5/2008 |
| WO | 2010011390 A2 | 1/2010 |

OTHER PUBLICATIONS

Baldo et al. Highly efficient phosphorescent emission from organic electroluminescent devices, Nature, vol. 395, pp. 151-154, 1998.
(Continued)

*Primary Examiner* — Nduka E Ojeh
*Assistant Examiner* — Laura M Dykes
(74) *Attorney, Agent, or Firm* — Butzel Long (57) ABSTRACT

Embodiments of the disclosed subject matter provide a device having a substrate, at least one organic light-emitting layer disposed over the substrate, and at least one down-conversion layer. The at least one down-conversion layer may generate the NIR emission by absorbing at least a portion of the light emitted by the at least one organic light emitting layer, and re-emitting light at a longer NIR wavelength or range of wavelengths having a peak NIR emission that may be greater than 700 nm, greater than 750 nm, or greater than 800 nm. An out-of-plane optical density of the at least one down-conversion layer may be less than 0.1 for all wavelengths of light in a range from 400 nm to 600 nm.

9 Claims, 7 Drawing Sheets

Related U.S. Application Data (60) Provisional application No. 62/597,648, filed on Dec. 12, 2017.

(58) Field of Classification Search
USPC .......................................................... 257/40
See application file for complete search history.

(56) References Cited

U.S. PATENT DOCUMENTS

| | | | |
|---|---|---|---|
| 5,703,436 | A | 12/1997 | Forrest |
| 5,707,745 | A | 1/1998 | Forrest |
| 5,834,893 | A | 11/1998 | Bulovic |
| 5,844,363 | A | 12/1998 | Gu |
| 6,013,982 | A | 1/2000 | Thompson |
| 6,087,196 | A | 7/2000 | Sturm |
| 6,091,195 | A | 7/2000 | Forrest |
| 6,097,147 | A | 8/2000 | Baldo |
| 6,294,398 | B1 | 9/2001 | Kim |
| 6,303,238 | B1 | 10/2001 | Thompson |
| 6,337,102 | B1 | 1/2002 | Forrest |
| 6,468,819 | B1 | 10/2002 | Kim |
| 7,279,704 | B2 | 10/2007 | Walters |
| 7,431,968 | B1 | 10/2008 | Shtein |
| 7,598,381 | B2 | 10/2009 | Thompson |
| 7,968,146 | B2 | 6/2011 | Wagner |
| 7,989,090 | B2 | 8/2011 | Thompson |
| 2003/0230980 | A1 | 12/2003 | Forrest |
| 2004/0174116 | A1 | 9/2004 | Lu |
| 2008/0088225 | A1* | 4/2008 | Weiss ................. G02F 1/1333 |
| | | | 313/503 |
| 2012/0319564 | A1 | 12/2012 | Ghosh |
| 2014/0034911 | A1 | 2/2014 | Yawei |
| 2014/0167602 | A1 | 6/2014 | Hack |
| 2016/0328090 | A1 | 11/2016 | Klinghult |
| 2016/0347996 | A1* | 12/2016 | Shimamoto ......... H01L 31/0384 |
| 2017/0229663 | A1 | 8/2017 | Tsai |
| 2018/0044586 | A1 | 2/2018 | Kwon |
| 2018/0212201 | A1 | 7/2018 | Bai |
| 2018/0261655 | A1 | 9/2018 | Lee |

OTHER PUBLICATIONS

Baldo, et al., "Very high-efficiency green organic light-emitting devices based on electrophosphorescence", Applied Physics Letters, Jul. 5, 1999, 4 pp., vol. 75, No. 1, American Institute of Physics, Melville, NY, USA.

Borek, et al., "Highly Efficient, Near-Infrared Electrophosphorescence from a Pt-Metalloporphyrin Complex", Angew. Chem. Int. Ed. 2007, 46, 1109-1112.

\* cited by examiner

1) Some % of total display

2) Some % of pixels have additional subpixel which is covered

3) Some % of pixels have a given sub-pixel covered

ORGANIC ELECTROLUMINESCENT DEVICES CONTAINING A NEAR-INFRARED DOWN-CONVERSION LAYER

CROSS-REFERENCE TO RELATED APPLICATIONS

This application is a continuation of U.S. patent application Ser. No. 16/217,104, filed Dec. 12, 2018, which claims priority to U.S. Provisional Patent Application Ser. No. 62/597,648, filed Dec. 12, 2017, the entire contents of each are incorporated herein by reference.

FIELD

The present invention relates to down-conversion structures for use in organic light emitting diodes, and devices including the same.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting diodes/devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Alternatively the OLED can be designed to emit white light. In conventional liquid crystal displays emission from a white backlight is filtered using absorption filters to produce red, green and blue emission. The same technique can also be used with OLEDs. The white OLED can be either a single EML device or a stack structure. Color may be measured using CIE coordinates, which are well known to the art.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY

According to an embodiment, an organic light emitting diode/device (OLED) is also provided. The OLED can include an anode, a cathode, and an organic layer, disposed between the anode and the cathode. According to an embodiment, the organic light emitting device is incorporated into one or more device selected from a consumer product, an electronic component module, and/or a lighting panel.

According to embodiment of the disclosed subject matter, a device may have a substrate, at least one organic light-emitting layer disposed over the substrate, and at least one down-conversion layer. The at least one down-conversion layer may generate the NIR emission by absorbing at least a portion of the light emitted by the at least one organic light emitting layer, and re-emitting light at a longer NIR wavelength or range of wavelengths having a peak NIR emission that may be greater than 700 nm, greater than 750 nm, or greater than 800 nm. An out-of-plane optical density of the at least one down-conversion layer may be less than 0.1 for all wavelengths of light in a range from 400 nm to 600 nm.

The at least one down-conversion layer may be disposed over the at least one light emitting layer. The out-of-plane optical density of the most absorptive of the at least one down-conversion layer may be between 0.01 to 0.1, or the out-of-plane optical density may be a sum of the at least one down-conversion layer that may be between 0.01 to 0.1. The at least one down-conversion layer may have a transparency in the wavelength range of 400 nm to 600 nm, or 400 nm to 650 nm. An in-plane optical density of a sum of the at least one down-conversion layer may be greater than 0.5, greater than 1, greater than 1.5, greater than 2, greater than 3, or greater than 5.

The at least one down-conversion layer may generate the NIR emission by absorbing at least a portion of the light emitted by a red sub-pixel or NIR sub-pixel of a panel that includes the at least one organic light emitting layer. The down-conversion layer may be selectively addressable by absorption of light emitted by a sub-pixel of a panel that includes the at least one organic light-emitting layer with a peak wavelength greater than 650 nm.

The device may include a near-infrared (NIR) emitter disposed in the at least one down-conversion layer has a concentration that is less than 30% by volume, less than 20% by volume, or less than 10% by volume.

The at least one down-conversion layer may be selectively patterned over the near-infrared (NIR) pixel or red sub-pixel of a panel including the at least one organic light emitting layer, and may generate the NIR emission by absorbing at least a portion of the light emitted by the near-infrared (NIR) pixel or the red sub-pixel. The optical excitation of the at least one down-conversion layer may include a selective excitation by an edge mounted light source. The at least one down conversion layer may include a near-infrared (NIR) emitter that is embedded into the waveguide or substrate which is photoexcited by the edge mounted light source.

The at least one down-conversion layer may produce at least a nearly Lambertian emission pattern. The at least one down-conversion layer may be directionally enhanced to output non-Lambertian or highly-directional emission. A size of the at least one down-conversion layer may be less than 110% of an area of any distinct sub-pixel, less than 105% of the area of any distinct sub-pixel, or 100% of the area of any distinct sub-pixel.

According to an embodiment, a display device may include a plurality of OLED pixels and sub-pixels, where less than 80%, less than 50%, less than 40%, or less than 30% of the plurality of OLED pixels have at least one near infra-red (NIR) down-conversion layer disposed over a given sub-pixel such that emission is converted to NIR light, and the remaining pixels do not include the down conversion layer. In some embodiments, the given sub-pixel is an additional red sub-pixel or near-infrared subpixel.

An out-of-plane optical density of the most absorptive of the at least one NIR down-conversion layer may be between 0.01 to 0.1, and the out-of-plane optical density of a sum of the at least one NIR down-conversion layer may be between 0.01 to 0.1 in a wavelength range selected from the group consisting of: 400 nm to 600 nm, 400 nm to 650 nm, and 400 nm to 700 nm. At least a portion of the OLED pixels includes a red sub-pixel or near-infrared sub-pixel in an emissive stack with the at least one NIR down-conversion layer. An out-of-plane optical density of a sum of the at least one NIR down-conversion layer may be greater than 0.5, greater than 1, or greater than 10. An out-of-plane optical density of a sum of the at least one NIR down-conversion layer may be less than 0.5, less than 0.1, and less than 0.05. A near-infrared (NIR) emitter disposed in the NIR down-conversion layer may have a concentration that is less than 30% by volume, less than 20% by volume, or less than 10% by volume.

According to an embodiment, display device may include a plurality of OLED pixels and sub-pixels, where less than 80%, less than 50%, less than 40%, or less than 30% of the plurality of OLED pixels of the display device have at least one down-conversion layer disposed over the plurality of pixels such that emission is converted to near infra-red (NIR) light, and the remaining pixels do not include the down-conversion layer.

According to an embodiment, a device may include a substrate, an at least one organic light-emitting layer disposed over the substrate, and at least one near-infrared (NIR) down-conversion layer disposed in a stack with the at least one organic light emitting layer to generate NIR emission from light emitted by the OLED stack.

The at least one NIR down-conversion layer may shift one or more wavelengths of emissions from one or more red sub-pixels or near-infrared (NIR) sub-pixels of the OLED stack. An out-of-plane optical density of a sum of the at least one down-conversion layer may be transmissive to a visible spectrum in the range that is greater than 0.5, greater than 1, or greater than 5. A near-infrared (NIR) emitter disposed in the at least one NIR down-conversion layer has a concentration that may be less than 30% by volume, less than 20% by volume, or less than 10% by volume. An in-plane optical density of a sum of the at least one NIR down-conversion layer may have an in-plane optical density that is greater than 1.5, greater than 2, or greater than 3. An out-of-plane optical density of a sum of the at least one NIR down-conversion layer may be less than 0.1 for light having a wavelength range from 400 nm to 600 nm. An optical excitation of the at least one NIR down-conversion layer may include a selective excitation by an edge mounted light source. The at least one NIR down-conversion layer may include an emitter that is optically excited by red or NIR light and has an optical density in the red or NIR. The out-of-plane optical density of the most absorptive of the at least one down-conversion layer may be between 0.01 to 0.1, or the out-of-plane optical density may be the sum of the at least one down-conversion layer is between 0.01 to 0.1.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), are incorporated by reference in their entireties. Phosphorescence is described in more detail in U.S. Pat. No. 7,279,704 at cols. 5-6, which are incorporated by reference.

Figure 1:
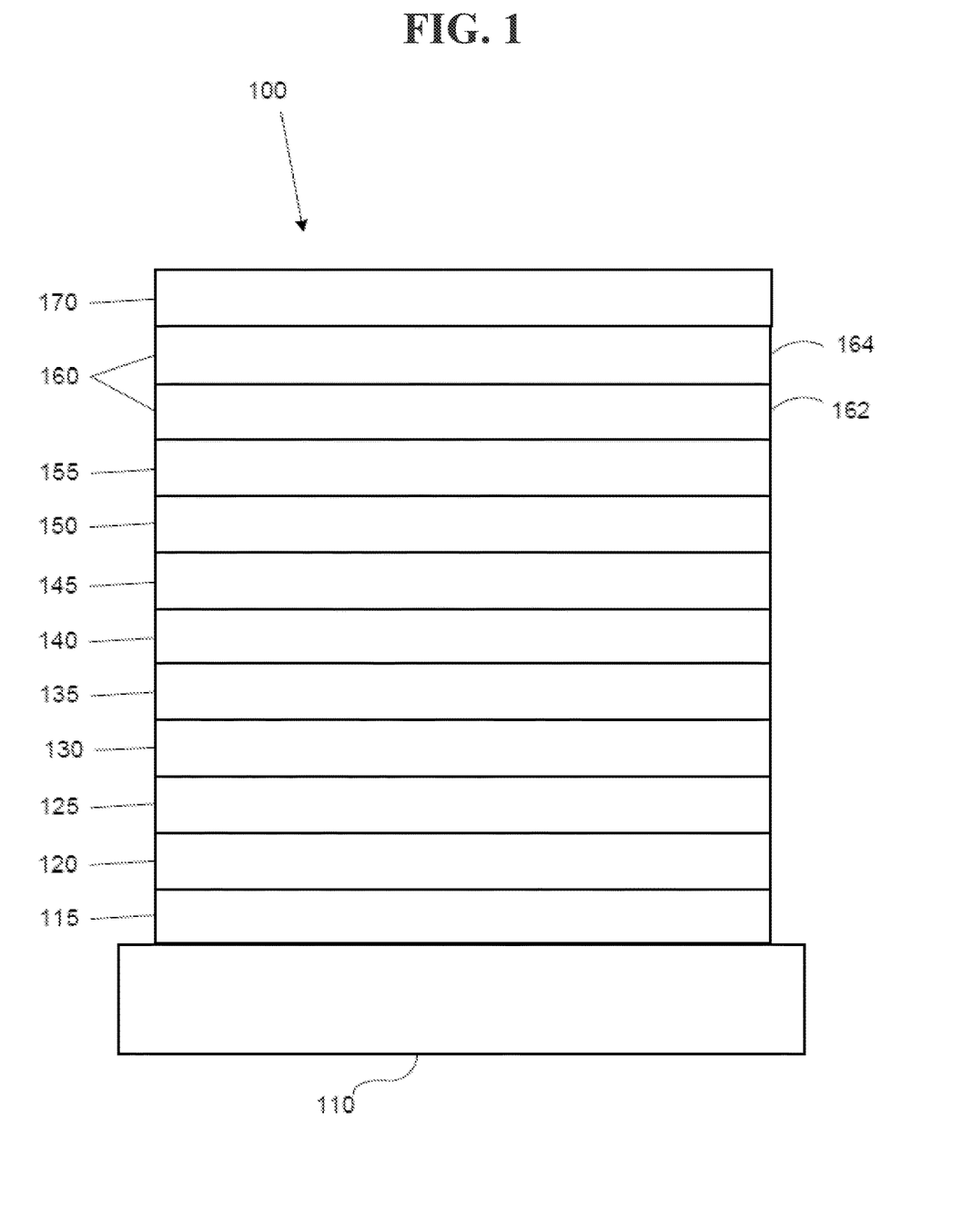
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
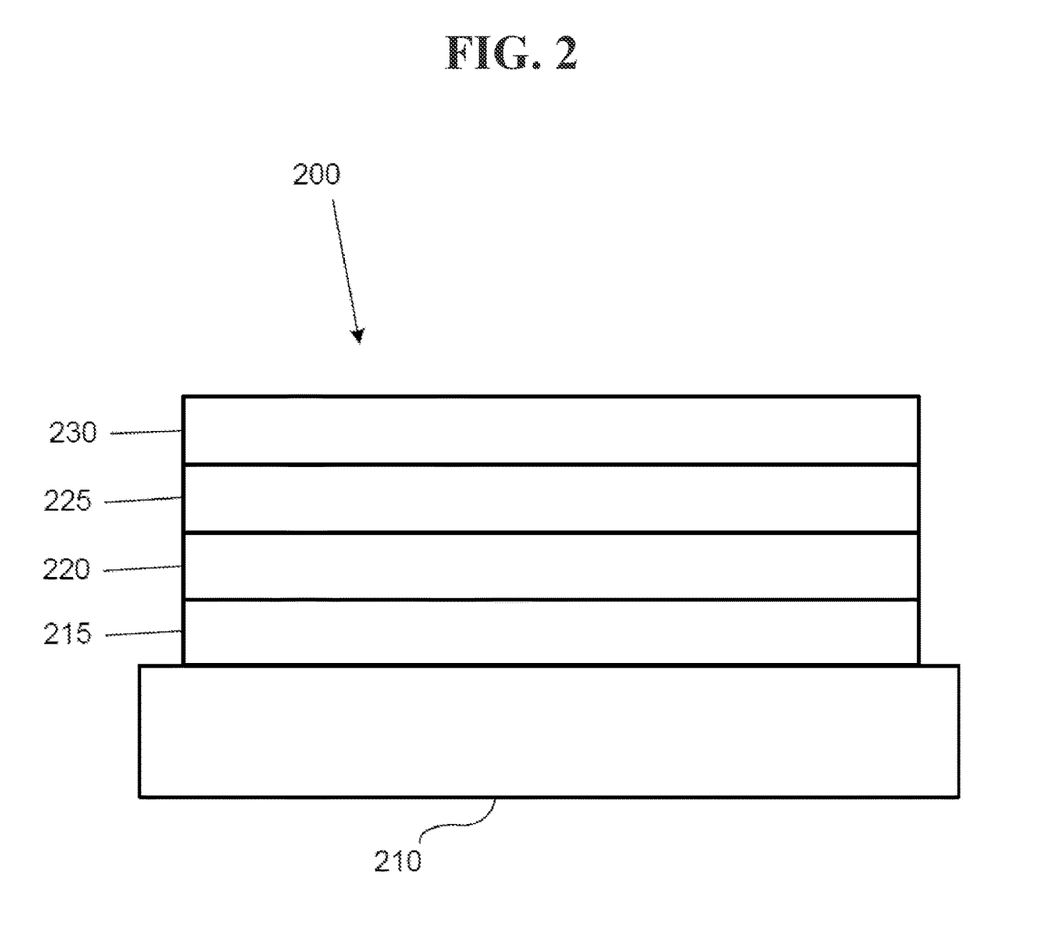
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention can be incorporated into a wide variety of electronic component modules (or units) that can be incorporated into a variety of electronic products or intermediate components. Examples of such electronic products or intermediate components include display screens, lighting devices such as discrete light source devices or lighting panels, etc. that can be utilized by the end-user product manufacturers. Such electronic component modules can optionally include the driving electronics and/or power source(s). Devices fabricated in accordance with embodiments of the invention can be incorporated into a wide variety of consumer products that have one or more of the electronic component modules (or units) incorporated therein. A consumer product comprising an OLED that includes the compound of the present disclosure in the organic layer in the OLED is disclosed. Such consumer products would include any kind of products that include one or more light source(s) and/or one or more of some type of visual displays. Some examples of such consumer products include flat panel displays, computer monitors, medical monitors, televisions, billboards, lights for interior or exterior illumination and/or signaling, heads-up displays, fully or partially transparent displays, flexible displays, laser printers, telephones, mobile phones, tablets, phablets, personal digital assistants (PDAs), wearable devices, laptop computers, digital cameras, camcorders, viewfinders, microdisplays (displays that are less than 2 inches diagonal), 3-D displays, virtual reality or augmented reality displays, vehicles, video walls comprising multiple displays tiled together, theater or stadium screen, and a sign. Various control mechanisms may be used to control devices fabricated in accordance with the present invention, including passive matrix and active matrix. Many of the devices are intended for use in a temperature range comfortable to humans, such as 18 C to 30 C, and more preferably at room temperature (20-25 C), but could be used outside this temperature range, for example, from −40 C to 80 C.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

Implementations of the disclosed subject matter provide an emissive color filter layer, referred to as a down-conversion layer, to generate near-infrared (NIR) emission from an organic electroluminescent device. Due to low emissive quantum yields and added challenges in device fabrication, integration of NIR emitters within an OLED stack may not prove feasible. In implementations of the disclosed subject matter, NIR emission may be generated by the use of a down-conversion layer which absorbs a portion of the display electroluminescence and re-emits at a longer NIR wavelength.

Near-infrared (NIR) organic light-emitting diodes (OLEDs) may have a number of applications including imaging, night vision, and medical therapies. However, producing NIR emission through direct electroluminescence may present significant challenges in low device efficiency and complication in the OLED stack fabrication. Many of these issues may be mitigated by using an emissive color filter layer (e.g., a down-conversion layer) by which higher energy photons may be selectively down-converted to the NIR through absorption and emission. This layer, which can be deposited on the bottom or top of the OLED stack (e.g., the OLED stack shown in FIG. 3B), may be a NIR emitter layer or a NIR emitter doped within a selectively absorptive matrix. Examples of NIR emitters that may be used include a phosphorescent emitter, an organic fluorescent emitter, a quantum dot (QD), or a combination thereof.

Figure 3A:
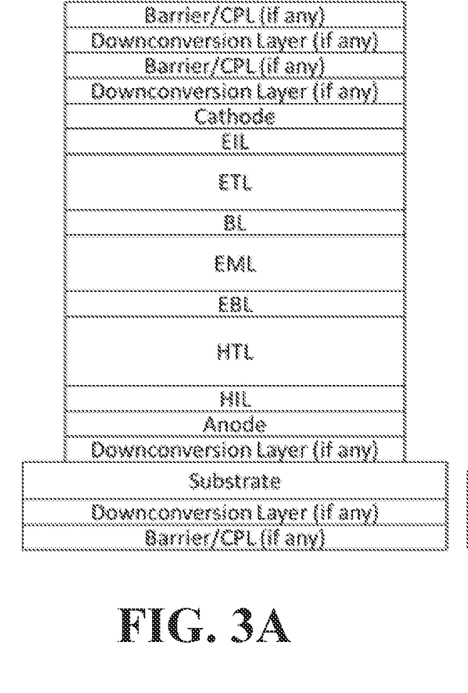
FIG. 3A shows an example top emission or bottom emission OLED device structure that includes one or more NIR down-conversion layers according to embodiments of the disclosed subject matter.

FIG. 3A shows an example top emission or bottom emission OLED device structure that includes one or more NIR down-conversion layers according to embodiments of the disclosed subject matter. The OLED device structure may include an optional barrier layers or capping layers (CPL) that may be disposed on optional down-conversion layers (e.g., NIR down-conversion layers). As shown in FIG. 3A, the barrier or CPL layers may be interleaved with down-conversion layers. The OLED stack may include a cathode that may be disposed on an electron injection layer (EIL). An electron transport layer (ETL) may be disposed on a blocking layer (BL), an emissive layer (EML), and an electron blocking layer (EBL). A hole transport layer (HTL) may be disposed on a hole injection layer (HIL), an anode, an optional down-conversion layer, a substrate, an optional down-conversion layer, and an optional barrier layer or capping layer.

Figure 3B:
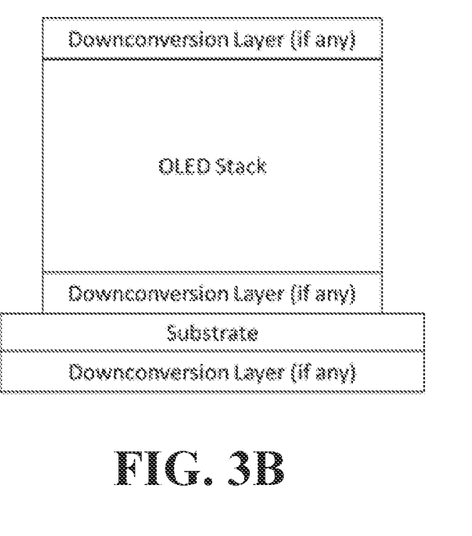
FIG. 3B shows an example of a simplified structure of the OLED device of FIG. 3A that includes one or more NIR down-conversion layers according to embodiments of the disclosed subject matter.

FIG. 3B shows an example of a simplified structure of the OLED device of FIG. 3A that includes one or more NIR down-conversion layers according to embodiments of the disclosed subject matter. An optional down-conversion layer may be disposed on an OLED stack (e.g., which may include a cathode that may be disposed on an electron injection layer (EIL), an electron transport layer (ETL), a blocking layer (BL), an emissive layer (EML), an electron blocking layer (EBL), a hole transport layer (HTL), a hole injection layer (HIL), and an anode). The OLED stack may be disposed on an optional down-conversion layer, a substrate, and an optional down-conversion layer.

The NIR down-conversion layer as shown in FIGS. 3A-3B may act as: (1) a photoswitchable pixel which depends on the emission spectrum of the underlying OLED pixel(s), or as (2) a color-purifying layer which redshifts the electroluminescent (EL) emission of a red pixel. In the first case, the layer absorption spectrum may be selected based on which pixel and/or color is desired to turn the NIR emission on and off. In the second case, the layer absorption spectrum may act as a long-pass filter for a red or NIR pixel, selectively absorbing the high energy photons of the red or NIR emitter/pixel and down-converting them to the desired NIR region. The layer may emit deep enough in the NIR so as to not present visible emission (e.g., emission having a wavelength between 400 nm and 700 nm). The NIR down-conversion layer may preferably have a peak emission wavelength that is greater than 700 nm, more preferably greater than 750 nm, and more preferably greater than 800 nm.

The configuration in the second case may allow for the process of NIR emission to depend on the absorption of EL emission from the OLED emissive layer and the photoluminescence quantum yield (PLOY) of the NIR emitter. Selective absorption of EL photons by the NIR down-conversion layer may be affected by the bandgap of the QD, organic, or organometallic NIR emitter, as well as any absorptive host material the NIR emitter may be embedded in. This may allow for the down-conversion layer to be transmissive to certain regions (e.g., the visible light spectrum of 400 nm to 700 nm) which may prevent disruption of the visible OLED operation. This may allow for switching of the NIR emission based on the emission of the OLED stack, or based on an emission of an external excitation source.

The transmission spectrum may determine the performance of the NIR down-conversion layer. The layer thickness and the extinction coefficient of the contained materials in the NIR down-conversion layer may increase color purity and NIR down-conversion efficiency. In the case of some organometallic emitters, such as platinum or iridium based emitters, concentration quenching issues may need to be considered. To minimize and/or prevent concentration quenching, the NIR emitter may be present in the down-conversion layer preferably at a concentration less than 30% by volume, more preferably less than 20% by volume, and more preferably less than 10% by volume. In the case of a dendritic, polymeric, quantum dot, or excimer based emitter, concentration quenching may not be an issue, or may be sufficiently avoidable with molecular structure considerations (e.g. quantum dot ligand sphere). If the down-conversion layer host material is non-absorptive in the excitation region, for instance, when the layer is acting as a down-conversion color filter for a red or NIR pixel, the down-conversion layer may absorb a sufficient amount of the excitation photons without greatly increasing the NIR emitter concentration. For example, the out-of-plane optical density of the most absorptive of the at least one down-conversion layer may be between 0.01 to 0.1, or the out-of-plane optical density may be a sum of the at least one down-conversion layer that may be between 0.01 to 0.1. The in-plane optical density of a sum of the at least one down-conversion layer may be greater than 0.5, greater than 1, greater than 1.5, greater than 2, greater than 3, or greater than 5. In some implementations, the down-conversion layer may have an optical density in the photoexcitation region greater than 1.5, more preferably greater than 2, and more preferably greater than 3.

Optical excitation of the NIR emissive down-conversion layer may take on a variety of forms including: (1) broadband excitation by partial absorption in the visible spectrum, (2) selective excitation by the red pixel and/or EML, (3) selective excitation by a NIR pixel and/or EML, and/or (4) selective excitation by an edge mounted waveguided light source such as an LED.

In case (1), the NIR down-conversion overlayer may be excited by one or more pixels and/or EML layers, and may emit continuously so long as the display is on in any form. A lower optical density layer may be used so as to partially filter the underlying visible emission. It may be preferable that the down-conversion layer have an optical density between 0.01 and 0.1. As this configuration may have indiscriminant photon absorption, the broad above-bandgap absorption of a material like a quantum dot may be used.

In case (2), the NIR down-conversion overlayer may act to selectively down-convert photons from the red pixel or EML. It may be preferable that the layer is partially absorptive with an optical density between 0.01 and 0.1. To have selective absorption in the red, a material may be used with an absorption peak in the red without significant absorption in the rest of the visible spectrum (e.g., 400 nm-700 nm), such as an organic fluorophore.

Similarly to case (2), case (3) may use a material with a peak absorption in the red-NIR region, such as an organic fluorophore. In this case, as the down-conversion layer may act to color shift a NIR pixel of higher than desired photon energy, the optical density may be preferably greater than 1.5, more preferably greater than 2, and more preferably greater than 3.

Figure 5A:
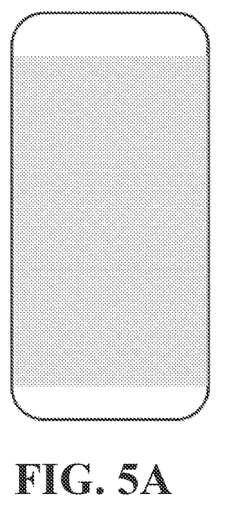
FIG. 5A shows an example configuration of a NIR down-conversion layer on a display face having a blanket coverage of a display according to embodiments of the disclosed subject matter.
Figure 5B:
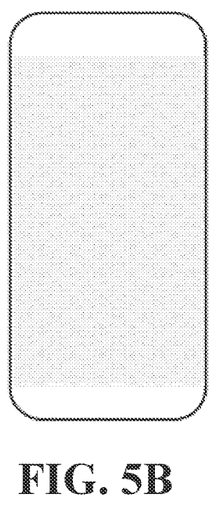
FIG. 5B shows an example configuration of a NIR down-conversion layer on a display face having coverage of all or a fraction of a given subpixel on a display according to embodiments of the disclosed subject matter.
Figure 5C:
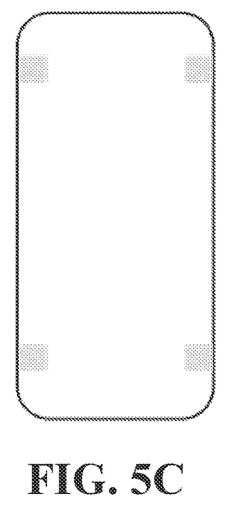
FIG. 5C shows an example configuration of a NIR down-conversion layer on a display face having selective regional coverage of a display according to embodiments of the disclosed subject matter.
Figure 5D:
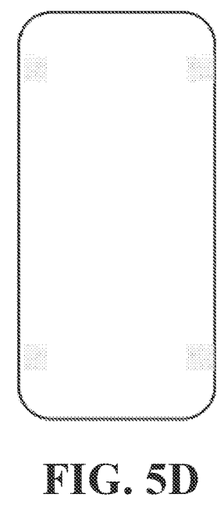
FIG. 5D shows an example configuration of a NIR down-conversion layer on a display face having coverage of all or a fraction of a given subpixel on a region of a display according to embodiments of the disclosed subject matter.
Figure 6:
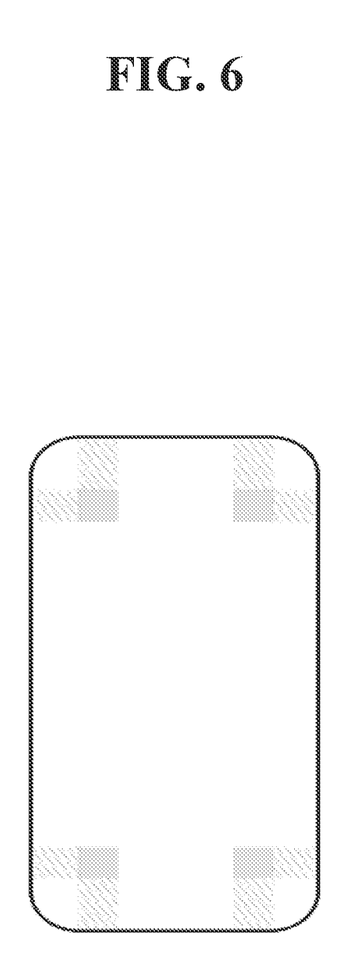
FIG. 6 shows a wave-guided excitation of a NIR down-conversion layer by edge-mounted excitation light sources according to embodiments of the disclosed subject matter.

In case (4), the NIR down-conversion emitter is embedded in a waveguide or substrate layer which is photoexcited by one or multiple edge-mounted light source(s) such as LEDs, as shown in FIG. 6. The down-conversion layer may include a near-infrared (NIR) emitter that is embedded into the waveguide or substrate which is photoexcited by the edge mounted light source. The down-conversion layer should, therefore, be largely transmissive to the visible with an OD preferably lower than 0.1 and more preferably lower than 0.01 in the visible. In one embodiment of this case, the down-conversion emitter may be optically excited in the red-NIR and have an optical density in this region. The NIR down-conversion layer may fully cover the display or be patterned in particular regions so as to emit as several point sources (see, e.g., FIGS. 5A-5D).

As shown in FIGS. 3A-3B, a device may have a substrate, at least one organic light-emitting layer disposed over the substrate (e.g., as part of an emissive layer (EML) as shown in FIG. 3A or as part of the OLED stack shown in FIG. 3B), and at least one down-conversion layer. In some embodiments, the down-conversion lay may be disposed over the at least one organic light emitting layer. As shown in FIGS. 3A-3B, one or more down-conversion layers may be disposed above or below the OLED stack or emissive layer (EML). The at least one down-conversion layer may generate the NIR emission by absorbing at least a portion of the light emitted by the at least one organic light emitting layer, and re-emitting light at a longer NIR wavelength or range of wavelengths having a peak NIR emission that may be greater than 700 nm, greater than 750 nm, or greater than 800 nm.

The down-conversion layer may have an in-plane optical density and/or an out-of-plane optical density. As used throughout, both the out-of-plane and in-plane optical density may be the optical density determined by first measuring the ordinary (out-of-plane) and extraordinary (in-plane) extinction coefficient of a sample of the same composition as the down-conversion layer by variable angle spectroscopic ellipsometry (VASE). The optical density may be calculated using the extinction coefficient obtained by VASE and the thickness of the film (for out-of-plane optical density), or the distance from the edge of the display to the farthest most point of the down-conversion layer patterned on the display (for in-plane optical density). The out-of-plane optical density may also be measured by normal-incidence transmission measurements on a sample of the same composition as the down-conversion layer with thickness equal to that used in the device. An in-plane optical density of a sum of the at least one down-conversion may be greater than 0.5, greater than 1, greater than 1.5, greater than 2, greater than 3, or greater than 5. In some embodiments, an out-of-plane optical density of the at least one down-conversion layer may be less than 0.1 for all wavelengths of light in a range from 400 nm to 600 nm. The out-of-plane optical density of the most absorptive of the at least one down-conversion layer may be between 0.01 and 0.1. In some embodiments, the out-of-plane optical density may be the sum of the at least one down-conversion layer that may be between 0.01 and 0.1.

The at least one down-conversion layer may have a transparency in the wavelength range of 400 nm to 600 nm, or 400 nm to 650 nm. As generally used throughout, transparency of the down-conversion layer may allow for at least 90% of light within the visible range of 400 nm to 600 nm to be transmitted. The transparency of the down-conversion layer shown in FIGS. 7B-7C and discussed below may desirably have less than 90% transmittance for light within the visible range of 400 nm to 600 nm.

The at least one down-conversion layer may generate the NIR emission by absorbing at least a portion of the light emitted by a red sub-pixel or NIR sub-pixel of a panel that includes the at least one organic light emitting layer. The panel may be part of a display device. The down-conversion layer may be selectively addressable by absorption of light emitted by a sub-pixel of a panel that includes the at least one organic light-emitting layer with a peak wavelength greater than 650 nm.

In some embodiments, the device may include a near-infrared (NIR) emitter disposed in the at least one down-conversion layer has a concentration that is less than 30% by volume, less than 20% by volume, or less than 10% by volume.

The at least one down-conversion layer may be selectively patterned over the near-infrared (NIR) pixel or red sub-pixel of a panel including the at least one organic light emitting layer, and may generate the NIR emission by absorbing at least a portion of the light emitted by the near-infrared (NIR) pixel or the red sub-pixel. The NIR pixel or red sub-pixel may be part of the emissive layer (EML) shown in FIG. 3A, the OLED stack shown in FIG. 3B, and/or the pixels and/or sub-pixels shown in FIGS. 4A-4D.

The at least one down-conversion layer may include an emitter that is optically excited by light of a red or near-infrared (NIR) spectrum. For example, the down-conversion layers shown in FIGS. 3A-3B and/or FIGS. 4A-4D may include an emitter that is optically excited by light of a red or near-infrared (NIR) spectrum (e.g., such as light emitted from a red sub-pixel NIR sub-pixel).

Figure 4A:
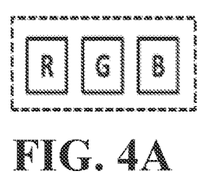
FIG. 4A shows a pixel structure having a placement for a NIR down-conversion layer with blanket coverage of all pixels according to embodiments of the disclosed subject matter.
Figure 4B:
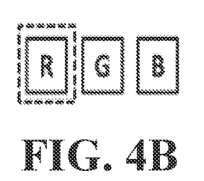
FIG. 4B shows a pixel structure having a placement for a NIR down-conversion layer with selective coverage of the red subpixel according to embodiments of the disclosed subject matter.
Figure 4C:
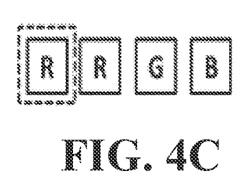
FIG. 4C shows a pixel structure having a placement for a NIR down-conversion layer with selective coverage of one of multiple individually addressed red subpixels according to embodiments of the disclosed subject matter.
Figure 4D:
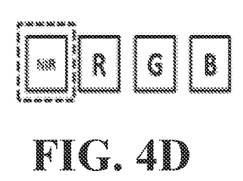
FIG. 4D shows a pixel structure having a placement for a NIR down-conversion layer with selective coverage of a NIR subpixel according to embodiments of the disclosed subject matter.

FIGS. 4A-4D show pixel and/or subpixel configurations for the NIR color filter layer. FIG. 4A shows blanket coverage of all pixels, FIG. 4B shows selective coverage of a red subpixel, FIG. 4C shows selective coverage of one of multiple individually addressed red subpixels, and FIG. 4D shows selective coverage of a NIR subpixel. The example configurations shown in FIGS. 4A-4B provide continuous NIR emission from a given pixel whenever it is on. The configurations shown in FIGS. 4C-4D provide for individual NIR pixel addressing, which may be advantageous when separately controllable NIR emission or emission in the absence of visible light is desired.

These individual NIR down-conversion layer subpixel designs may be applied selectively on a greater display, as shown in FIGS. 5A-5D. The subpixel pattern shown in FIGS. 4A-4D may be applied to the whole display (e.g., a blanket cover of a display, as shown in FIG. 5A), all or a fraction of a given subpixel (e.g., coverage of all or a fraction of a given subpixel on a display, as shown in FIG. 5B), a whole region (e.g., a selective regional coverage of a display, as shown in FIG. 5C) or all or a fraction of subpixels in a given region (e.g., coverage of all or a fraction of a subpixel on a region, as shown in FIG. 5D). Partial coverage may provide on-off control of the NIR emission, as well as fine tuning of the NIR brightness. The partial coverable may provide less reduction of the underlying subpixel efficiency (e.g., in the case of R (red), G (green), or B (blue) NIR photoexcitation).

Figure 7A:
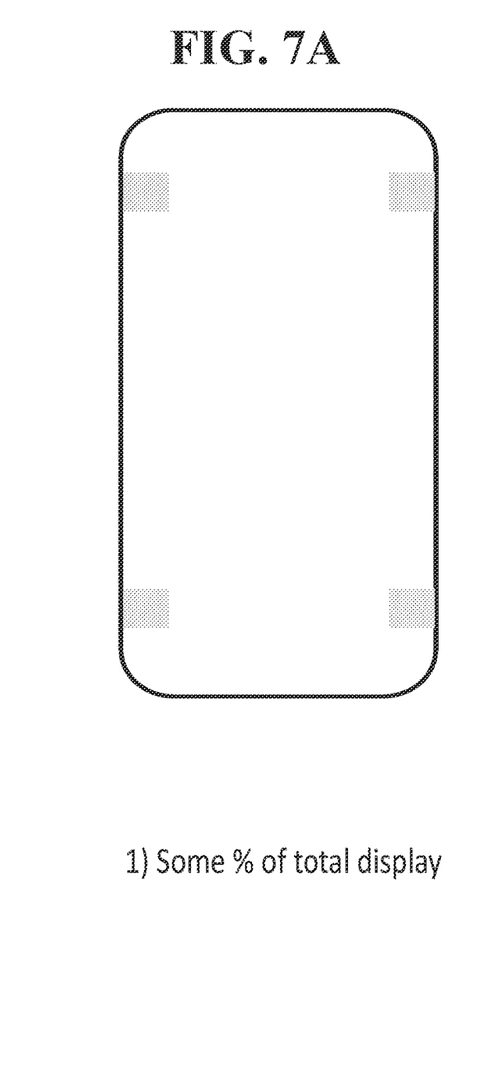
FIGS. 7A-7C show example configurations of NIR down-conversion layers disposed over a portion of a display or particular sub-pixels according to embodiments of the disclosed subject matter.
Figure 7B:
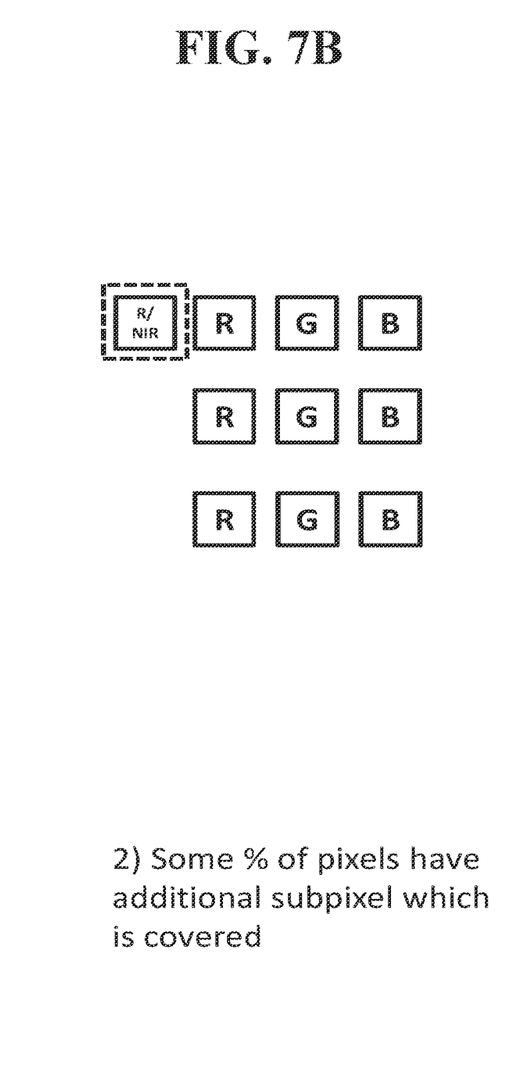
Figure 7C:
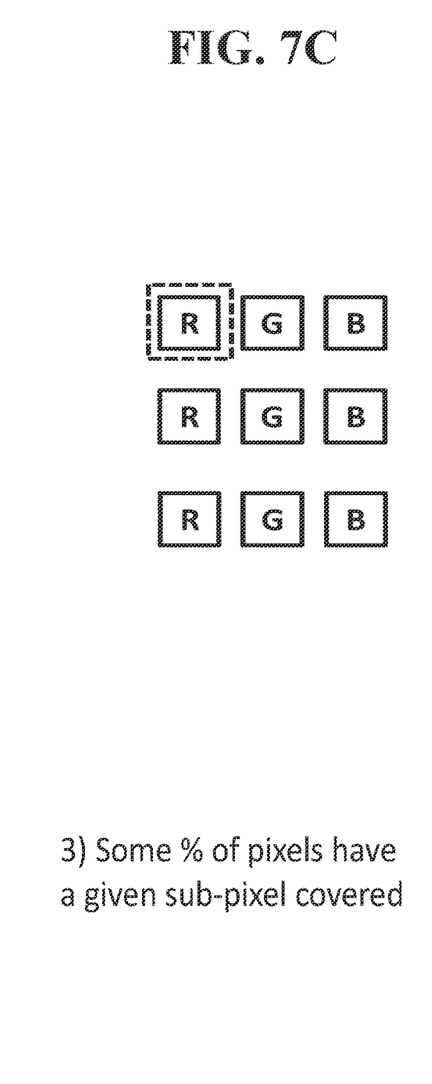

According to an embodiment, a display device may include a plurality of OLED pixels and sub-pixels, where less than 80%, less than 50%, less than 40%, or less than 30% of the plurality of OLED pixels have at least one down-conversion layer disposed over a given sub-pixel such that emission may be converted to near infra-red (NIR) light, and the remaining pixels do not include the down-conversion layer (see, e.g., FIG. 7C). In some implementations, the given sub-pixel may be an additional red sub-pixel or a near-infrared sub-pixel (see, e.g., FIG. 7B). An out-of-plane optical density of the most absorptive of the at least one down-conversion layer is between 0.01 to 0.1, and the out-of-plane optical density of a sum of the at least one down-conversion layer is between 0.01 to 0.1 in a wavelength range which may be 400 nm to 600 nm, 400 nm to 650 nm, or 400 nm to 700 nm. At least a portion of the OLED pixels includes a red sub-pixel or near-infrared sub-pixel in an emissive stack with the at least one down-conversion layer (see, e.g., FIGS. 3A-3B and FIGS. 4A-4D). An out-of-plane optical density of a sum of the at least one down-conversion layer may be greater than 0.5, greater than 1, or greater than 10. An out-of-plane optical density of a sum of the at least one down-conversion layer may be less than 0.5, less than 0.1, or less than 0.05. A near-infrared (NIR) emitter disposed in the down-conversion layer may have a concentration that is less than 30% by volume, less than 20% by volume, or less than 10% by volume.

According to an embodiment, a device may include a substrate, an at least one organic light-emitting layer disposed over the substrate, and at least one near-infrared (NIR) down-conversion layer disposed in a stack with the at least one organic light emitting layer to generate NIR emission from light emitted by the OLED stack. The features of this embodiment may be shown, for example, in FIGS. 3A-3B.

In these embodiments, the at least one NIR down-conversion layer may shift one or more wavelengths of emissions from one or more red sub-pixels or near-infrared (NIR) sub-pixels (as shown, e.g., in FIGS. 4A-4D) of the OLED stack (as shown, e.g., in FIG. 3B). An out-of-plane optical density of a sum of the at least one down-conversion layer may be transmissive to a visible spectrum in the range that is greater than 0.5, greater than 1, or greater than 5. A NIR emitter disposed in the at least one NIR down-conversion layer as shown in FIGS. 4A-4D may have a concentration that may be less than 30% by volume, less than 20% by volume, or less than 10% by volume. An in-plane optical density of a sum of the at least one NIR down-conversion may be greater than 1.5, greater than 2, or greater than 3. An out-of-plane optical density of a sum of the at least one NIR down-conversion layer may be less than 0.1 for light having a wavelength range from 400 nm to 600 nm. The at least one NIR down-conversion layer may include an emitter that is optically excited by red or NIR light. The out-of-plane optical density of the most absorptive of the at least one down-conversion layer may be between 0.01 and 0.1, or the out-of-plane optical density may be the sum of the at least one down-conversion layer is between 0.01 and 0.1.

FIGS. 7A-7C show example configurations of NIR down-conversion layers disposed over a portion of a display or particular sub-pixels according to embodiments of the disclosed subject matter. FIG. 7A shows a display device having a plurality of OLED pixels and sub-pixels, where less than 80% of the plurality of OLED pixels of the display device have at least one down-conversion layer disposed over the plurality of pixels such that emission is converted to near infra-red (NIR) light, and the remaining pixels do not include the down-conversion layer. FIG. 7B shows a display device having a plurality of OLED pixels and sub-pixels, where less than 80% of the plurality of OLED pixels have at least one down-conversion layer disposed over an additional red sub-pixel or near-infrared subpixel such that emission is converted to near infra-red (NIR) light, and the remaining pixels do not include the down-conversion layer. FIG. 7C shows a display device having a plurality of OLED pixels and sub-pixels, where less than 80% of the plurality of OLED pixels have at least one down-conversion layer disposed over a given sub-pixel such that emission is converted to near infra-red (NIR) light, and the remaining pixels do not include the down-conversion layer. In some embodiments of the examples shown in FIGS. 7A and 7C, less than 50% of the plurality of OLED pixels may have at least one down-conversion layer disposed over a given sub-pixel such that emission may be converted to near infra-red (NIR) light, and the remaining pixels do not include the down-conversion layer. In other embodiments, less than 40% or less than 30% of the plurality of OLED pixels may have at least one down-conversion layer disposed over a given sub-pixel such that emission may be converted to near infra-red (NIR) light. In the examples shown in FIGS. 7B-7C, it may be desirable for a peak optical density of the NIR down conversion layers to be greater than 0.5, greater than 1.0, greater than 1.5, and the like for light having a wavelength range from 400 nm to 800 nm.

In general, the placement of the color down-conversion filter (e.g., a down-conversion layer) at the exterior of the device may produce a Lambertian or nearly Lambertian emission pattern. In some embodiments, the emission pattern may be independent of the emission pattern of the underlying OLED device stack (e.g., the OLED stack shown in FIG. 3B). In some embodiments, the at least one down-conversion layer may produce at least a nearly Lambertian emission pattern that is independent of the emission pattern of the at least one organic light emitting layer.

In the case where the near-infrared pixel is used for broad illumination (e.g., for retinal tracking), this Lambertian pattern may be desirable. When non-Lambertian or highly directional emission is desired, the color filter layer (e.g., the down-conversion layer(s) shown in FIGS. 3A-3B) may be directionally enhanced by, for example, utilization of a plasmonic perforated metal film. That is, at least one down-conversion layer may be directionally enhanced to output non-Lambertian or highly-directional emission. This may be applicable when the NIR down-conversion layer is selectively patterned, rather than covering the RGB pixels, so as to avoid any disruption of the RGB emission pattern. When selectively patterned, the spatial overlap of the color filter layer (e.g., the down conversion layer(s)) with any distinct subpixel may be considered. A size of the color filter layer (e.g., the down-conversion layer(s)) may be less than 110% of an area of any distinct sub-pixel, less than 105% of the area of any distinct sub-pixel, or 100% of the area of any distinct sub-pixel.

In some embodiments, the OLED has one or more characteristics selected from the group consisting of being flexible, being rollable, being foldable, being stretchable, and being curved. In some embodiments, the OLED is transparent or semi-transparent. In some embodiments, the OLED further comprises a layer comprising carbon nanotubes.

In some embodiments, the OLED further comprises a layer comprising a delayed fluorescent emitter. In some embodiments, the OLED comprises a RGB pixel arrangement or white plus color filter pixel arrangement. In some embodiments, the OLED is a mobile device, a hand held device, or a wearable device. In some embodiments, the OLED is a display panel having less than 10 inch diagonal or 50 square inch area. In some embodiments, the OLED is a display panel having at least 10 inch diagonal or 50 square inch area. In some embodiments, the OLED is a lighting panel.

In some embodiments of the emissive region, the emissive region further comprises a host.

In some embodiments, the compound can be an emissive dopant. In some embodiments, the compound can produce emissions via phosphorescence, fluorescence, thermally activated delayed fluorescence, i.e., TADF (also referred to as E-type delayed fluorescence), triplet-triplet annihilation, or combinations of these processes.

The OLED disclosed herein can be incorporated into one or more of a consumer product, an electronic component module, and a lighting panel. The organic layer can be an emissive layer and the compound can be an emissive dopant in some embodiments, while the compound can be a non-emissive dopant in other embodiments.

The organic layer can also include a host. In some embodiments, two or more hosts are preferred. In some embodiments, the hosts used maybe a) bipolar, b) electron transporting, c) hole transporting or d) wide band gap materials that play little role in charge transport. In some embodiments, the host can include a metal complex. The host can be an inorganic compound.

Combination with Other Materials

The materials described herein as useful for a particular layer in an organic light emitting device may be used in combination with a wide variety of other materials present in the device. For example, emissive dopants disclosed herein may be used in conjunction with a wide variety of hosts, transport layers, blocking layers, injection layers, electrodes and other layers that may be present. The materials described or referred to below are non-limiting examples of materials that may be useful in combination with the compounds disclosed herein, and one of skill in the art can readily consult the literature to identify other materials that may be useful in combination.

Various materials may be used for the various emissive and non-emissive layers and arrangements disclosed herein. Examples of suitable materials are disclosed in U.S. Patent Application Publication No. 2017/0229663, which is incorporated by reference in its entirety.

Conductivity Dopants:

A charge transport layer can be doped with conductivity dopants to substantially alter its density of charge carriers, which will in turn alter its conductivity. The conductivity is increased by generating charge carriers in the matrix material, and depending on the type of dopant, a change in the Fermi level of the semiconductor may also be achieved. Hole-transporting layer can be doped by p-type conductivity dopants and n-type conductivity dopants are used in the electron-transporting layer.

HIL/HTL:

A hole injecting/transporting material to be used in the present invention is not particularly limited, and any compound may be used as long as the compound is typically used as a hole injecting/transporting material.

EBL:

An electron blocking layer (EBL) may be used to reduce the number of electrons and/or excitons that leave the emissive layer. The presence of such a blocking layer in a device may result in substantially higher efficiencies, and or longer lifetime, as compared to a similar device lacking a blocking layer. Also, a blocking layer may be used to confine emission to a desired region of an OLED. In some embodiments, the EBL material has a higher LUMO (closer to the vacuum level) and/or higher triplet energy than the emitter closest to the EBL interface. In some embodiments, the EBL material has a higher LUMO (closer to the vacuum level) and or higher triplet energy than one or more of the hosts closest to the EBL interface. In one aspect, the compound used in EBL contains the same molecule or the same functional groups used as one of the hosts described below.

Host:

The light emitting layer of the organic EL device of the present invention preferably contains at least a metal complex as light emitting material, and may contain a host material using the metal complex as a dopant material. Examples of the host material are not particularly limited, and any metal complexes or organic compounds may be used as long as the triplet energy of the host is larger than that of the dopant. Any host material may be used with any dopant so long as the triplet criteria is satisfied.

HBL:

A hole blocking layer (HBL) may be used to reduce the number of holes and/or excitons that leave the emissive layer. The presence of such a blocking layer in a device may result in substantially higher efficiencies and/or longer lifetime as compared to a similar device lacking a blocking layer. Also, a blocking layer may be used to confine emission to a desired region of an OLED. In some embodiments, the HBL material has a lower HOMO (further from the vacuum level) and or higher triplet energy than the emitter closest to the HBL interface. In some embodiments, the HBL material has a lower HOMO (further from the vacuum level) and or higher triplet energy than one or more of the hosts closest to the HBL interface.

ETL:

An electron transport layer (ETL) may include a material capable of transporting electrons. The electron transport layer may be intrinsic (undoped), or doped. Doping may be used to enhance conductivity. Examples of the ETL material are not particularly limited, and any metal complexes or organic compounds may be used as long as they are typically used to transport electrons.

Charge Generation Layer (CGL)

In tandem or stacked OLEDs, the CGL plays an essential role in the performance, which is composed of an n-doped layer and a p-doped layer for injection of electrons and holes, respectively. Electrons and holes are supplied from the CGL and electrodes. The consumed electrons and holes in the CGL are refilled by the electrons and holes injected from the cathode and anode, respectively; then, the bipolar currents reach a steady state gradually. Typical CGL materials include n and p conductivity dopants used in the transport layers.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

We claim:

1. A device comprising:
   a substrate;
   an at least one organic light-emitting layer disposed over the substrate; and
   at least one near-infrared (NIR) down-conversion layer disposed in a stack with the at least one organic light emitting layer to generate NIR emission from light emitted by the stack,
   wherein the at least one NIR down-conversion layer shifts one or more wavelengths of emissions from one or more sub-pixels of the stack, and
   wherein an out-of-plane optical density of a sum of the at least one NIR down-conversion layer is selected from the group consisting of: between 0.5-10, and between 10-20, and between 20-100.

2. The device of claim 1, wherein the at least one NIR down-conversion layer shifts one or more wavelengths of emissions from one or more red sub-pixels or near-infrared (NIR) sub-pixels of the OLED stack.

3. The device of claim 1, wherein an out-of-plane optical density of a sum of the at least one down-conversion layer is transmissive to a visible spectrum in the range selected from the group consisting of: greater than 0.5, greater than 1, and greater than 5.

4. The device of claim 1, wherein a near-infrared (NIR) emitter disposed in the at least one NIR down-conversion layer has a concentration selected from the group consisting of: less than 30% by volume, less than 20% by volume, and less than 10% by volume.

5. The device of claim 1, wherein an in-plane optical density of a sum of the at least one NIR down-conversion layer is selected from the group consisting of: greater than 1.5, greater than 2, and greater than 3.

6. The device of claim 1, wherein an out-of-plane optical density of a sum of the at least one NIR down-conversion layer is less than 0.1 for light having a wavelength range from 400 nm to 600 nm.

7. The device of claim 1, wherein optical excitation of the at least one NIR down-conversion layer includes a selective excitation by an edge mounted light source.

8. The device of claim 1, wherein the at least one NIR down-conversion layer includes an emitter that is optically excited by red or NIR light and has an optical density in the red or NIR.

9. The device of claim 1, wherein the out-of-plane optical density is selected from the group consisting of: the out-of-plane optical density of the most absorptive of the at least one down-conversion layer is between 0.01 to 0.1, and the out-of-plane optical density is the sum of the at least one down-conversion layer is between 0.01 to 0.1.

* * * * *